(12) United States Patent
Gore et al.

(10) Patent No.: US 6,946,362 B2
(45) Date of Patent: Sep. 20, 2005

(54) METHOD AND APPARATUS FOR FORMING HIGH SURFACE AREA MATERIAL FILMS AND MEMBRANES

(75) Inventors: Makarand P. Gore, Corvallis, OR (US); John Stephen Dunfield, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 353 days.

(21) Appl. No.: 10/236,429

(22) Filed: Sep. 6, 2002

(65) Prior Publication Data

US 2004/0048466 A1 Mar. 11, 2004

(51) Int. Cl.[7] .......................... H01L 21/30; H01L 21/46
(52) U.S. Cl. ........................ 438/455; 438/1; 438/680
(58) Field of Search ........................ 438/1, 455, 680, 438/778, 964

(56) References Cited

U.S. PATENT DOCUMENTS

| | | |
|---|---|---|
| 4,717,630 A | 1/1988 | Hamakawa et al. |
| 5,062,025 A | 10/1991 | Verhoeven et al. |
| 5,680,292 A | 10/1997 | Thompson, Jr. et al. |
| 6,051,503 A | 4/2000 | Bhardwaj et al. |
| 6,187,210 B1 * | 2/2001 | Lebouitz et al. ............... 216/11 |
| 6,187,685 B1 | 2/2001 | Hopkins et al. |
| 6,376,096 B1 | 4/2002 | Pearson et al. |
| 2002/0020688 A1 * | 2/2002 | Sherman et al. ............... 216/2 |

FOREIGN PATENT DOCUMENTS

| | | |
|---|---|---|
| EP | 1229152 A1 | 8/2002 |
| WO | WO 96/08036 | 3/1996 |
| WO | WO 02/43937 | 6/2002 |

* cited by examiner

Primary Examiner—Alexander Ghyka

(57) ABSTRACT

The present invention discloses a method and apparatus for producing high surface area material films and membranes on substrates. In one application, patterns of spikes or bristles are produced on wafers and transferred to films, such as conductive polymer or metal films, by using repetitive and inexpensive processes, such as electroplating and embossing. Such a technique provides low cost, high surface area materials and allows reuse of expensive patterned silicon. Membranes with high surface area are extremely valuable in fuel cells since the power density is generally proportional to the surface area and the patterns may be used to cast inexpensive fuel cell electrodes.

12 Claims, 2 Drawing Sheets

Grassy Silicon Template

Nickel Electroformed Film with Complementary Patterned Surface

METHOD AND APPARATUS FOR FORMING HIGH SURFACE AREA MATERIAL FILMS AND MEMBRANES

FIELD OF THE INVENTION

The present invention is directed to the field of high surface area material films and membranes.

BACKGROUND OF THE INVENTION

High efficiency catalysts are important in a vast number of applications and processes. Efficient catalysts are necessary for achieving desired performance in fuel cells, organic synthesis, catalytic cracking, auto exhausts, etc. One determinant of efficiency is the surface area available for reaction. For example, when catalysts are used with electrodes in electrochemical applications such as fuel cells, electrical and electrochemical energy storage and peak power increases in proportion with increasing surface area of the electrode. Therefore, the ability to easily manufacture high area surfaces with a variety of chemistries is important to the preparation of efficient catalysts.

SUMMARY OF THE INVENTION

The present invention discloses a method and apparatus for producing high surface area material films and membranes on substrates. In one application, patterns of spikes or bristles are produced on wafers and transferred to films, such as conductive polymer or metal films, by using repetitive and inexpensive processes. Such a technique provides low cost, high surface area materials and allows reuse of expensive patterned silicon. Membranes with high surface area are extremely valuable in fuel cells since the power density is generally proportional to the surface area and the patterns may be used to cast inexpensive fuel cell electrodes.

BRIEF DESCRIPTION OF THE DRAWING

The invention is described with reference to the several figures of the drawing, in which.

DETAILED DESCRIPTION OF THE INVENTION

Figure 1:
FIG. 1 is an SEM micrograph of a grassy silicon template created according to one embodiment of the invention.

Referring now to the figures of the drawing, the figures constitute a part of this specification and illustrate exemplary embodiments to the invention. It is to be understood that in some instances various aspects of the invention may be shown exaggerated or enlarged to facilitate an understanding of the invention.

The invention exploits the amenability of a silicon surface to topological and chemical modification. Plasma etching processes are typically used to create trenches and other features for use in microelectromechanical systems (MEMS); however, these techniques may be adapted to create a textured surface with surface features having at least one of various shapes including: grassy, spiked, stepped, dimpled, pored or bristled. An embodiment of the invention utilizes the Advanced Silicon Etch (ASE) process developed by Surface Technology Systems (Newport, UK). The ASE process is based on a sidewall passivation mechanism for etching anisotropic structures. Anisotropy is defined as:

$$A = 1 - V_l/V_v$$

where $V_l$ is the lateral etch rate and $V_v$ is the vertical etch rate. Passivation protects the sidewalls of etched structures and inhibits thermal and chemical etching, enabling production of vertical walls and deep trenches. However, non-selective passivation over an entire silicon surface may decrease the etch rate. In ASE, etching and passivation cycles are alternated instead of adding both etchants and passivants to the plasma at once. Typically, oxygen or hydrogen is added to the plasma to form the passivation layer.

Previous investigators have recognized that silicon structures other than vertical trenches may have practical applications. For example, black silicon, whose surface has tall spikes that are longer than the wavelength of visible light, is useful for anti-reflective coatings. However, most refinement of plasma etching techniques has aimed to reduce production of grassy silicon.

The present invention recognizes the utility of grassy or bristled silicon and utilizes ASE techniques to vary the aspect ratio and density of the spikes or bristles. The inventive apparatus and method provides for an inexpensive way of producing high surface area films and submicron structures in many applications. In one exemplary embodiment, $SF_6$ is used as the etchant and $C_4F_8$ is used as the passivant. The process conditions are as follows:

| | |
|---|---|
| Total process time | 20 min |
| Etch cycle | 9 sec |
| Passivation cycle | 9 sec |
| Etch gas | $SF_6$ at 130 sccm |
| Passivation gas | $C_4F_8$ at 85 sccm |
| Etch pressure | 25 mtorr |
| Passivation pressure | 12 mtorr |
| Temperature | ~25–30° C. |
| Coil Power | 600 W |
| Platen Power | 6–10 W |

These conditions result in spikes about 200 nm high. Adjustment of the processing parameters will change both the dimensions of the spikes and their aspect ratios. FIG. 1 shows that the techniques of the invention may be used to generate grassy silicon with submicron features and aspect ratios of 1:10, 1:50, or even greater. Use of non-oxygen containing gases in the plasma not only facilitates the formation of grassy structures but allow formation of structures with high surface areas.

Figure 2:
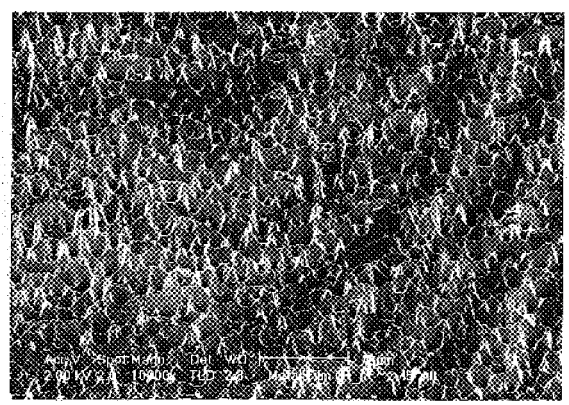
FIG. 2 is an SEM micrograph of one embodiment of the invention showing an electroplated nickel film with a complementary surface pattern.

The grassy structures are then coated with a catalytic material, for example, ruthenium, rhodium, cobalt, iron, nickel, palladium, rhenium, osmium, platinum, tungsten, or alloys thereof. Chemical vapor deposition, sputtering, evaporation, embossing and electroplating are examples of techniques that may be used to deposit catalytic or other materials on the grassy surface. The catalytic material film is then separated from the grassy surface silicon wafer. FIG. 2 is an SEM micrograph of an electroplated nickel film with a complementary surface to that shown in FIG. 1. A nickel film was deposited by electroplating on the silicon wafer having the bristled pattern shown in FIG. 1. The electroplated nickel film was then removed to reveal the complementary surface shown in FIG. 2.

In other embodiments, the deposited material may be a conductive polymer such as Nafion®. Alternatively, biological molecules such as DNA, RNA, amino acids, proteins, enzymes, antibodies, lipids, carbohydrates, etc. may be deposited onto the silicon spikes or onto a coating previously disposed on the silicon surface for use in biological probes. Graphite may also be deposited on the surface to form an electrical probe.

By using repetitive and inexpensive processes such as embossing or electroplating to transfer the bristled surface pattern to material films, the invention provides for the manufacture of low cost, high surface area materials and allows reuse of expensive patterned silicon. Such membranes with high surface area are extremely valuable in fuel cells since the power density is generally proportional to the surface area and the patterns may be used to cast inexpensive fuel cell electrodes. Experiments using palladium deposition followed by treatment with hydrogen and reaction with oxygen have shown very high catalytic activity similar to the original silicon wafer. Indeed, the embossing experiments performed showed transfer of pattern at sub-micron levels from silicon to polymer. The wells created by the spikes of sub-micron dimension (e.g., spikes having diameters of less than 1 micron) are abundant and contribute to the higher surface area. This method lends itself for ready adaptation to roll-to-roll processing and provides the way for mass forming high activity electrodes.

One skilled in the art will recognize that a wide variety of surface modification techniques may be used to deposit materials on the spikes. Standard chemical techniques may be used to modify the etched silicon or coated surface. For example, metals, inorganic materials, or organometallic molecules may be adsorbed onto the surface or the silicon surface itself may be modified chemically, for example, through formation of an oxide layer. Electrochemical techniques may be used to deposit various materials, such as oxidative catalysts for fuel cells. Electroless deposition techniques may be used to deposit metals on the surface. Organosilanes may be attached to the surface to form self-assembled monolayers, or SAMs. These SAMs may be further modified by standard chemical techniques.

Figure 3A:
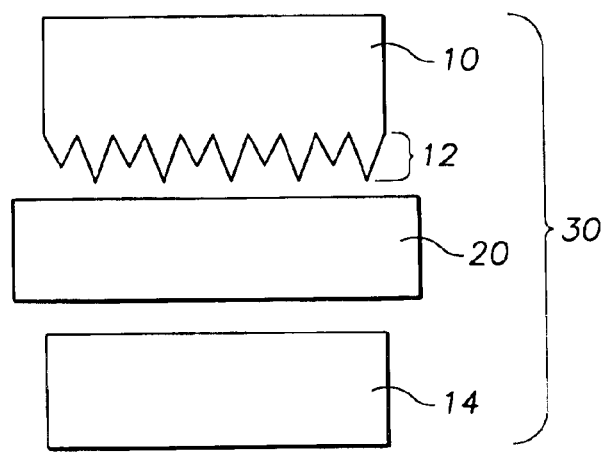
FIG. 3 illustrates an assembly and embossing process according to one embodiment of the invention.
Figure 3B:
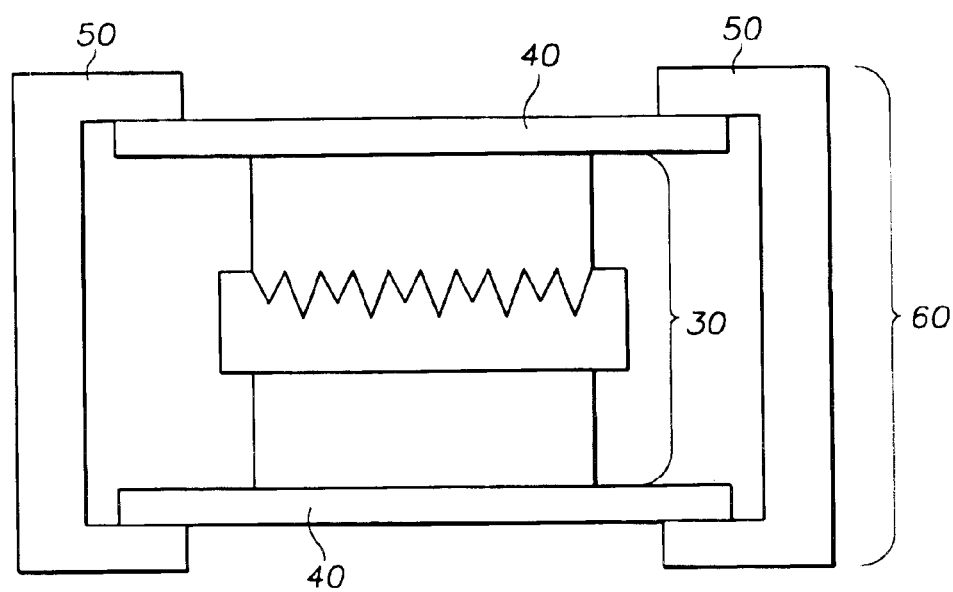
Figure 3C:
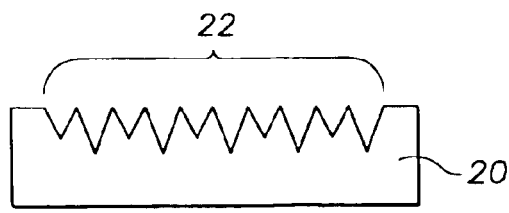

FIG. 3 illustrates an assembly and embossing process according to one embodiment of the invention. FIG. 3A shows the preparation of a silicon wafer 10 with a bristled pattern 12 for embossing a film 20. FIG. 3B shows the whole assembly 60 used for the embossing process. FIG. 3C shows embossed film 20 having a surface pattern 22 that is a complementary reproduction of the bristled pattern 12 in the silicon wafer 10. In one example, the silicon wafer 10 having bristled surface pattern 12 was sputtered with approximately 250 Angstroms platinum on one side and a plain "flat" silicon wafer 14 with similar treatment was used for the embossing of the other side (as described in a later example, surface pattern 12 could also potentially be sputtered with multiple layers, such as stainless steel 316 on top of the platinum layer). A film 20 (e.g. conductive polymer Nafion® 117 film) was sandwiched between the respective surfaces to form a wafer assembly 30. The wafer assembly 30 was mounted between steel plates 40 and put into a small 'shop vice' 50. The whole assembly 60 was put in an oven at 140° C. for 1 hour. The whole assembly 60 was cooled and the wafer assembly 30 was soaked in water until the silicon wafers fell off to produce the embossed film 20 having a surface pattern 22 that is a complementary reproduction of the bristled pattern 12 in the silicon wafer. Scanning Electron Micrographs showed the film to be complementary to the respective silicon patterns demonstrating a "hand to glove" type of pattern reproducibility at nanometer scale. The side of the film embossed with the "flat" silicon showed very small surface features in comparison to the bristled pattern side.

Multiple sputtering depositions are possible. In another example, a grassy silicon wafer sputtered with about 250 angstroms of platinum was subsequently sputtered with stainless steel 316 with average thickness of about 220 angstroms. Scanning Electron Micrographs showed the coating to be completely conformal to the grassy pattern. The wafer was subjected to a nickel electroplating bath to deposit approximately 10 microns of film. The film was separated from the wafer "mandrel" showing "hand to glove" pattern reproducibility at nanometer scale.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A wafer assembly for high surface area film production, comprising:
    a wafer with a textured surface; and
    a film deposited onto the wafer, wherein said film is separable from said wafer and a surface pattern of said textured surface is reproduced on said film, and wherein the surface pattern reproduced on the film includes features having dimensions of less than about 1 micron.

2. The assembly of claim 1 wherein the textured surface comprises surface features having shapes selected from the group consisting of bristles, spikes, grass, steps, dimples and pores.

3. The assembly of claim 2 wherein the shapes are bristles.

4. The assembly of claim 1 wherein, said film is selected from the group consisting of: a metal, a conductive polymer, and a biological material.

5. The assembly of claim 4 wherein said metal is selected from the group consisting of: ruthenium, rhodium, cobalt, iron, nickel, palladium, rhenium, osmium, platinum, and tungsten, and alloys thereof.

6. A wafer assembly for high surface area film production, comprising:
    a wafer with a textured surface; and
    a film deposited onto the wafer, wherein said film is separable from said wafer and a surface pattern of said textured surface is reproduced on said film, and wherein said film includes a biological material that is selected from the group consisting of: a lipid, a protein, an enzyme, an antibody, DNA, RNA, an amino acid, and a carbohydrate.

7. The assembly of claim 1 wherein said surface pattern of the textured surface reproduced on said film is within nanometer scale.

8. The assembly of claim 1, further comprising at least one preparation material, wherein said at least one preparation material is applied onto the wafer in preparation for deposition of said film.

9. The assembly of claim 8 wherein said at least one preparation material is selected from the group consisting of: stainless steel, ruthenium, rhodium, cobalt, iron, nickel, palladium, rhenium, osmium, platinum, and tungsten, and alloys thereof.

10. The assembly of claim 1 wherein said film has a thickness of about 10 microns.

11. A wafer assembly for high surface area film production, comprising:
    a wafer with a textured surface; and
    a film deposited onto the wafer, wherein said film is separable from said wafer and a surface pattern of said textured surface is reproduced on said film, and wherein said film includes a catalytic material.

12. The assembly of claim 11, wherein the surface pattern reproduced on the film includes features having dimensions of less than about 1 micron.

* * * * *